(12) United States Patent
Kim et al.

(10) Patent No.: US 7,489,544 B2
(45) Date of Patent: Feb. 10, 2009

(54) FLASH MEMORY DEVICE HAVING MULTI-LEVEL CELL AND READING AND PROGRAMMING METHOD THEREOF

(75) Inventors: Dong-Hwan Kim, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/035,357

(22) Filed: Feb. 21, 2008

(65) Prior Publication Data

US 2008/0151632 A1 Jun. 26, 2008

Related U.S. Application Data

(62) Division of application No. 11/250,720, filed on Oct. 14, 2005, now Pat. No. 7,359,245, which is a division of application No. 10/888,944, filed on Jul. 8, 2004, now Pat. No. 7,035,144.

(30) Foreign Application Priority Data

Jul. 11, 2003 (KR) ................................ 2003-47171

(51) Int. Cl.
*G11C 11/34* (2006.01)
(52) U.S. Cl. .............................. 365/185.03; 365/185.18; 365/185.19; 365/189.15
(58) Field of Classification Search ............ 365/185.03, 365/185.18, 185.19, 189.15
See application file for complete search history.

(56) References Cited

U.S. PATENT DOCUMENTS 5,986,929 A * 11/1999 Sugiura et al. ......... 365/185.03
6,163,485 A 12/2000 Kawahara et al.
6,426,892 B2 7/2002 Shibata et al.
6,490,201 B2 12/2002 Sakamoto
6,625,057 B2 * 9/2003 Iwata ........................ 365/158

(Continued)

FOREIGN PATENT DOCUMENTS

JP 02000339975 A * 12/2000

OTHER PUBLICATIONS

Takeuchi, Ken, Tanaka, Tomoharu and Tanzawa, Toru, A Multipage Cell Architecture for High-Speed Programming Multilevel NAND Flash Memories, IEEE Journal of Solid-State Circuits, vol. 33, No. 8, Aug. 1998, pp. 1228-1238.

*Primary Examiner*—Viet Q Nguyen
(74) *Attorney, Agent, or Firm*—Marger Johnson & McCollom, P.C.

(57) ABSTRACT

There is provided a flash memory device with multi-level cell and a reading and programming method thereof. The flash memory device with multi-level cell includes a memory cell array, a unit for precharging bit line, a bit line voltage supply circuit for supplying a voltage to the bit line, and first to third latch circuits each of which performs different function from each other. The reading and programming methods are performed by LSB and MSB reading and programming operations. A reading method in the memory device is achieved by reading an LSB two times and by reading an MSB one time. A programming method is achieved by programming an LSB one time and programming an MSB one time. Data having multi-levels can be programmed into memory cells by two times programming operations.

2 Claims, 11 Drawing Sheets

U.S. PATENT DOCUMENTS

| | | |
|---|---|---|
| 6,807,096 B2 | 10/2004 | Toda |
| 6,870,763 B2 | 3/2005 | Banks |
| 7,035,144 B2 * | 4/2006 | Kim et al. .............. 365/185.18 |
| 7,117,295 B2 * | 10/2006 | Kunori ....................... 711/103 |
| 7,164,601 B2 * | 1/2007 | Mitani et al. ........... 365/185.03 |
| 7,200,044 B2 * | 4/2007 | Won et al. .............. 365/185.22 |
| 7,221,598 B2 * | 5/2007 | Jeong .................... 365/185.28 |
| 7,254,064 B2 * | 8/2007 | Kim et al. .............. 365/189.05 |
| 7,296,111 B2 * | 11/2007 | Kunori ....................... 711/103 |
| 7,301,825 B2 * | 11/2007 | Seong et al. .......... 365/189.011 |
| 7,359,245 B2 * | 4/2008 | Kim et al. .............. 365/185.18 |

\* cited by examiner

Fig. 6

| LSB Read | PB SET | BL precharge | Sense & Latch | BL precharge | Sense & Latch | Data Out | |
|---|---|---|---|---|---|---|---|
| RESET_M | ⎍ | | | | | | |
| RESET_S | ⎍ | | | | | | |
| RESET_C | | | | | | ⎍ | |
| PLOAD | | ⎴ | | ⎴ | | | |
| LCH_S | | | ⎍ | | | | |
| LCH_MR | | | | | ⎍ | | |
| VBL2 | ⎴ | | | | | ⎴ | |
| PCLOAD | | | | | | ⎍ | |
| DI | | | | | | ⎍ | |
| A | L | S | LLLH | S | S | X | |
| B | H | S | HHHL | S | S | X | |
| C | H | S | S | S | HLLH | S | |
| D | L | S | S | S | LHHL | S | |
| E | L | H | LLLH | H | LHHL | L | |
| F | X | X | X | X | X | H | HLLH |
| G | X | X | X | X | X | L | LHHL |
| DQ | Data on node G is inverted and read out at exterior | | | | | | HLLH |

Fig. 7

| MSB Read | PB SET | BL precharge | Sense & Latch | Data Out | |
|---|---|---|---|---|---|
| RESET_M | ⎍ | | | | |
| RESET_C | | | | ⎍ | |
| PLOAD | | ⎎ | | | |
| LCH_MR | | | ⎍ | | |
| LCH_MS | | | ⎍ | | |
| VBL2 | ⎍ | | | ⎍ | |
| PCLOAD | | | | ⎍ | |
| DI | | | | | ⎍ |
| A | X | X | X | X | |
| B | X | X | X | X | |
| C | H | S | HHLL | S | |
| D | L | S | LLHH | S | |
| E | L | H | LLHH | L | |
| F | X | X | X | H | HHLL |
| G | X | X | X | L | LLHH |
| DQ | Data on node G is inverted and read out at exterior. | | | | HHLL |

Fig. 9

| LSB Program | CACHE PBSET | DATA LOADING | PBSET | DUMP | PGM | VERIFY |
|---|---|---|---|---|---|---|
| PLOAD | | | ⎴ | | | |
| VBL1 | | | | | ⎴ | |
| VBL2 | | | | | ⎴ | |
| LCH_MR | | | ⎴ | | | |
| LCH_MS | | | ⎴ | | | |
| RESET_C | ⎴ | | | | | |
| PDUMP | | | | ⎴ | | |
| DI | | ⎴ | | | | |
| A | X | X | X | S | X | |
| B | X | X | X | S | X | |
| C | X | X | L | LHHL | S | |
| D | X | X | H | HLLH | S | |
| E | X | X | H | HLLH | S | |
| F | H | HLLH | S | S | X | |
| G | L | LHHL | S | S | X | |
| DQ | Data on node G is inverted and loaded at exterior. |

Fig. 10

| MSB Program | CACHE PBSET | DATA LOADING | PBSET | DUMP | LSB READ | PGM | VERIFY1 | VERIFY2 |
|---|---|---|---|---|---|---|---|---|
| PLOAD | | ⎴ | | | | ⎴ | ⎴ | ⎴ |
| VBL1 | | | | | | ⎴ | | |
| VBL2 | | | | | | ⎴ | | |
| LCH_MR | | | ⎴ | | | | | |
| LCH_MS | | | ⎴ | | | | | |
| RESET_S | | | | ⎴ | | | | |
| LCH_S | | | | ⎴ | | | | |
| DI | | ⎴ | | | | | | |
| RESET_C | ⎴ | | | | | | | |
| PDUMP | | | | ⎴ | | | | |
| A | X | X | X | L | LH | S | S | S |
| B | X | X | X | H | HL | S | S | S |
| C | X | X | L | LLHH | S | S | LH | LH |
| D | X | X | H | HHLL | S | S | HL | HL |
| E | X | X | H | H | LH | HHLL | LLHH | |
| F | H | HHLL | S | S | X | X | X | X |
| G | L | LLHH | S | S | X | X | X | X |
| DQ | Data on node G is inverted and loaded at exterior. | | | | | | | |

FLASH MEMORY DEVICE HAVING MULTI-LEVEL CELL AND READING AND PROGRAMMING METHOD THEREOF

This application is a divisional of U.S. patent application Ser. No. 11/250,720, filed on Oct. 14, 2005, now U.S. Pat. No. 7,359,245, which is a divisional of U.S. patent application Ser. No. 10/888,944, filed Jul. 8, 2004, now U.S. Pat. No. 7,035,144, issued Apr. 25, 2006, which claims priority from Korean Patent Application No. 2003-47171, filed on Jul. 11, 2003, the contents of which are incorporated by reference.

FIELD OF THE INVENTION

This disclosure relates to a flash memory device, and more particularly, to a flash memory device having multi-level cell (MLC) and a reading and programming method thereof.

DESCRIPTION OF THE RELATED ART

Flash memory devices are generally classified into NAND flash memory devices and NOR flash memory devices. While NOR flash memory devices include memory cells that are independently connected to bit lines and word lines and have an excellent random access time, NAND flash memory devices include memory cells that are connected in series so that only one contact per cell string is necessary. Therefore, NAND flash memory devices have an excellent degree of integration. Accordingly, NAND structures are mainly used in high-integrated flash memory devices.

A well-known NAND flash memory device includes a memory cell array, a row decoder and a page buffer. The memory cell array includes word lines elongating along rows, bit lines elongating along columns, and cell strings corresponding to the respective bit lines.

The cell strings are connected in series to string select transistors, memory cells and ground select transistors, in that sequence, along the bit lines. A current path of the string select transistor in the cell string is connected to the corresponding bit line and a current path of the memory cells. A current path of the ground select transistor is connected between a common source line and a current path of the memory cells. A string select line, word lines and a common source line are connected to gates of the string select transistor, control gates of the memory cell transistors and a gate of the ground select transistor, respectively.

Each of the memory cells is provided with a cell transistor having a control gate, a floating gate, a source and a drain. As well known, the cell transistors perform a programming operation using Fowler-Nordheim tunneling (F-N tunneling).

Meanwhile, the well-known row decoder, which is connected to the string select line, the word lines and the common source line, is located at one side of the memory cell array. Additionally, the page buffer connected to the plurality of bit lines is located at the other side of the memory cell array.

Recently, for the purpose of increasing the integration of such a flash memory device, developments have been actively made on a multi bit cell that is capable of storing multiple bits of data into one memory cell. Such a memory cell is usually called a multi-level cell (MLC). Meanwhile, a single bit memory cell is called a single-level cell (SLC).

Generally, the multi-level cell has two or more threshold voltage distributions, and has two or more data storage states corresponding to the voltage distributions. As shown in FIG. 11a, the multi-level cell that can program 2-bit data has four data storage states, referred to as [11], [10], [01] and [00]. These distributions correspond to the threshold voltage distributions of the multi-level cell. For example, assuming that the respective threshold voltage distributions of the memory cell are −2.7 V or less, 0.3 V to 0.7 V, 1.3 V to 1.7 V, and 2.3 V to 2.7 V, the states [11], [10], [01] and [00] correspond to −2.7 V or less, 0.3 V to 0.5 V, 1.3 V to 1.7 V, and 2.3 V to 2.7 V, respectively.

A reading operation of the flash memory device with multi-level cells is carried out by detecting data of a multi-level cell by a difference between cell currents flowing through a selected memory cell according to a constant amount of bit line current and a word line voltage of step-shaped waveform. Referring to FIG. 11b, a conventional data reading method includes the steps of: applying word line voltages to a selected word line three times at regular intervals; and applying word line voltages equal to Vread to unselected word lines during the reading operation. At this time, the voltage applied to the selected word line is applied sequentially from a high voltage to a low voltage. In other words, a voltage Vrd3 applied between the states [00] and [01] is 2 V, a voltage Vrd2 applied between the states [01] and [10] is 1 V, and a voltage Vrd1 applied between the states [10] and [11] is 0 V. Meanwhile, a voltage (e.g., Vread=6 V) capable of turning on the unselected memory cells is applied to the unselected word lines. A detailed description of the reading operation is disclosed in Korean Patent Publication No. 10-0204803.

A programming operation of the flash memory device with multi-level cell is carried out by applying a predetermined program voltage (e.g., 14 V to 19 V) to the gate of the selected memory cell using F-N tunneling and then applying a ground voltage Vss to the bit line. A power supply voltage Vcc is applied to the bit line in order to prevent the programming. If the program voltage and the ground voltage Vss are respectively applied to the word line and the bit line of the selected memory cell, a relatively high electric field is applied between a floating gate and a channel of the memory cell. Due to the electric field, electrons of the channel pass through an oxide layer formed between the floating gate and the channel, so that a tunneling occurs therein. In this manner, a threshold voltage of the memory cell programmed by an accumulation of the electrons in the floating gate is increased. FIG. 12 is a diagram that illustrates a programming operation according to the related art. According to the related art, the programming operation is performed three times in order to reach the data storage state shown in FIG. 12. For example, if the desired state is [00], the programming is achieved through stages 1, 2 and 3, and if the desired state is [01], the programming is achieved through the stages 1 and 2 and the program prevention. A detailed description of the programming operation is disclosed in Korean Patent Publication No. 10-0204803.

Embodiments of the invention address limitations of the prior art.

SUMMARY OF THE INVENTION

Accordingly, embodiments of the invention are directed to a flash memory devices that substantially obviates one or more problems due to limitations and disadvantages of the related art.

Embodiments of the invention provide flash memory devices and programming methods thereof, in which an effectiveness of the reading and programming operations is improved, and particularly, the time of the programming operations is reduced.

Additional embodiments of the invention are set forth in part in the description which follows and in part will become apparent to those having ordinary skill in the art upon examination of the following or may be learned from practice of the invention. Embodiments of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and, together with the description, serve to explain the principle of the invention. In the drawings:

FIG. 6 is a timing chart of an LSB reading operation in a flash memory device according to an embodiment of the invention.

FIG. 7 is a timing chart of an MSB reading operation in a flash memory device according to an embodiment of the invention.

FIG. 9 is a timing chart of an LSB programming operation of a flash memory device according to an embodiment of the invention.

FIG. 10 is a timing chart of an MSB programming operation of a flash memory device according to an embodiment of the invention.

DETAILED DESCRIPTION OF THE INVENTION

Reference will now be made in detail to the preferred embodiments of the invention, examples of which are illustrated in the accompanying drawings. However, the present invention is not limited to the embodiments illustrated hereinafter, and the embodiments herein are rather introduced to provide easy and complete understanding of the scope and spirit of the invention.

I. Flash Memory Device

Figure 1:
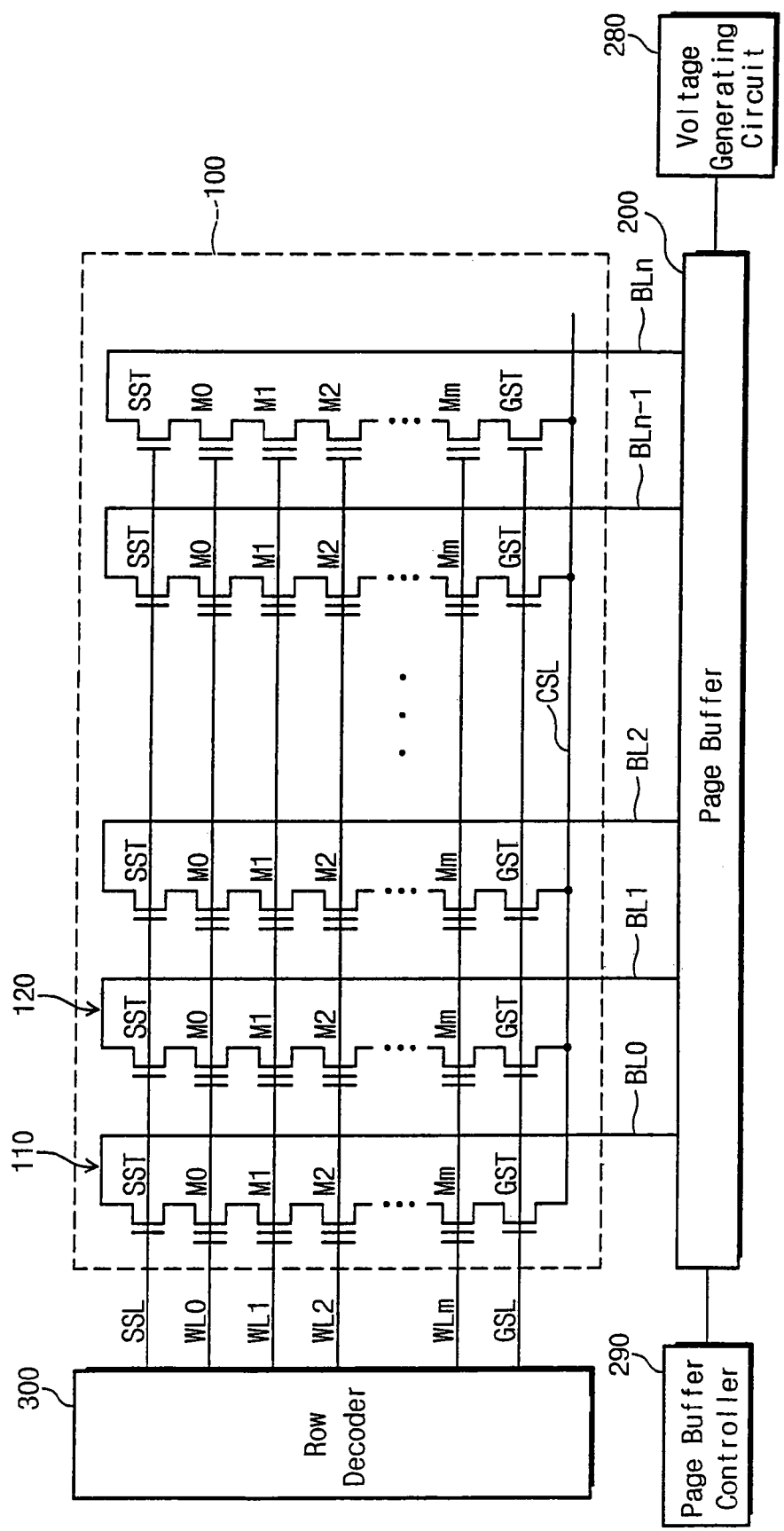
FIG. 1 is a block diagram illustrating a memory cell array of a NAND flash memory device according to an embodiment of the invention.

FIG. 1 is a circuit diagram of a memory cell array according to an embodiment of the invention.

Referring to FIG. 1, the memory cell array includes word lines WL0 to WLm, bit lines BL0 to BLn and memory cells M0 and Mm. A row decoder 300, which is connected to a string select line SSL, the word lines WL0 to WLm and a ground select line GSL, is located at one side of the memory cell array 100. The row decoder 300 selects a word line by a combination of a decoding that selects a corresponding memory block and a decoding that selects one word line within the selected string according to an address provided thereto.

Additionally, a page buffer 200 connected to the plurality of bit lines BL0 to BLn is located at another side of the memory cell array 100. A page buffer controller 290 for supplying a control signal, a reset signal and a load signal to the page buffer 200 and a voltage generator circuit 280 for supplying a variable voltage to the page buffer 200 are located on both sides of the page buffer.

Figure 2:
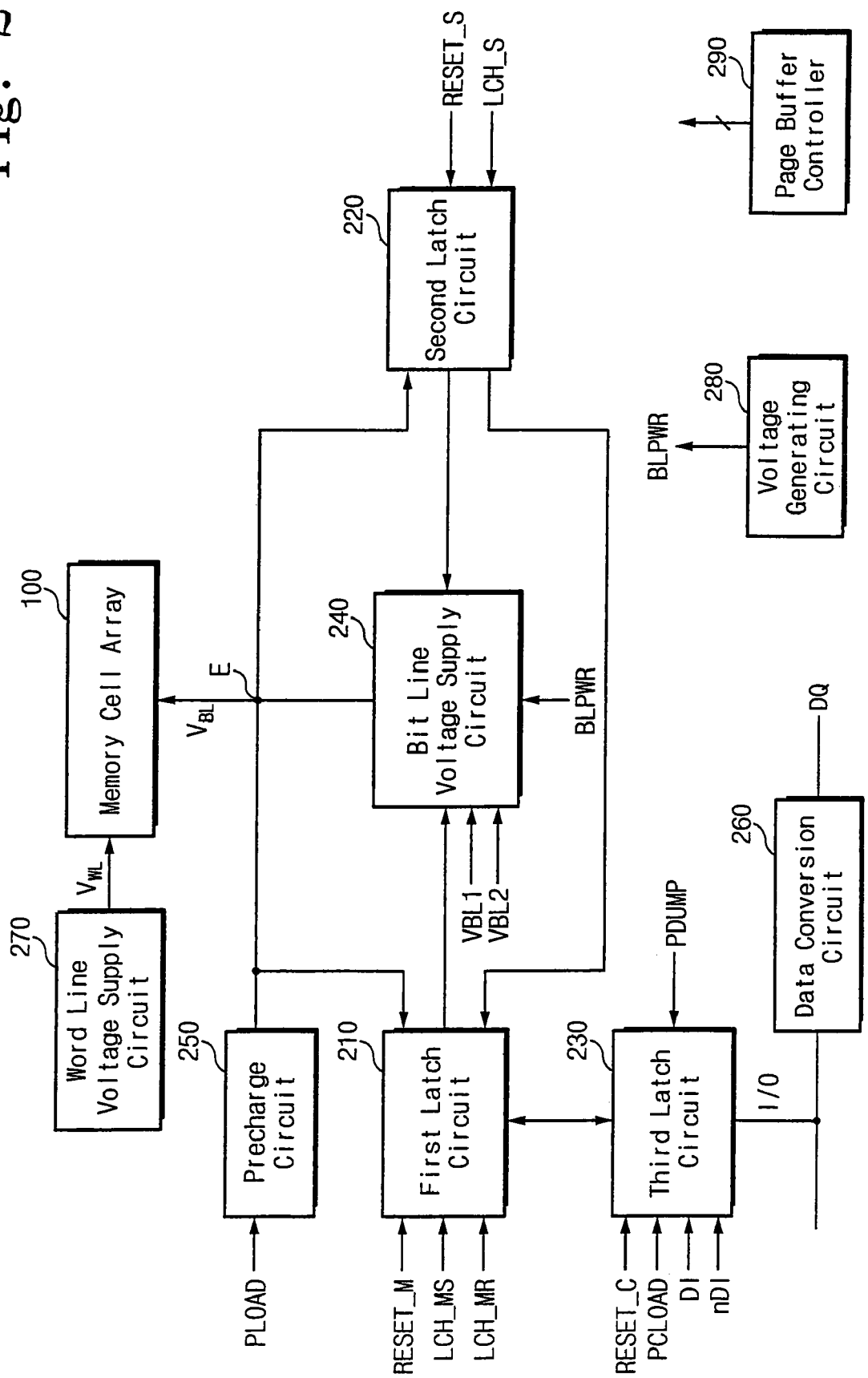
FIG. 2 is a block diagram of a flash memory device with multi-level cell according to an embodiment of the invention.

FIG. 2 is a block diagram of the flash memory device according to an embodiment of the invention. A function of each block will be described below with reference to FIG. 2.

The memory cell array 100 stores data bits that are at least 2 bits. The data bits are classified into a lower data bit and an upper data bit. Here, the lower data bit is defined as "LSB" and the upper data bit is defined as "MSB." For example, for data bits of [10], an upper data bit "1" is the MSB and a lower data bit "0" is the LSB. The data bits are divided according to the threshold voltage distributions of the memory cell. In this specification, it is assumed that [11] is −2.7 V or less, [10] is 0.3 V to 0.7 V, [00] is 1.3 V to 1.7 V, and [01] is 2.3 V to 2.7 V with respect to the threshold voltage distributions corresponding to the data bits. Of course, these are only example voltage ranges, and embodiments of the invention are effective with other ranges as well.

A word line voltage VWL determined at the reading and programming operations is applied to selected or unselected word lines of the memory cell array 100. The word line voltage VWL is supplied from a word line voltage supply circuit 270. The word line voltage levels will be described below in detail at a section of the reading and programming operations.

A precharge circuit 250 is operated in response to a first load signal PLOAD to a precharge bit line or a node E. Additionally, the precharge circuit 250 controls first and second latch circuits 210 and 220 according to a level of the node E.

The first latch circuit 210 is controlled by first and second latch signals LCH_MR and LCH_MS and the second latch circuit 220 is controlled by a third latch signal LCH_S. Using a bit line voltage supply circuit 240, the latched data bits are programmed into the memory cell 100 or the programmed data bits are read out. A third latch circuit 230 is controlled by a second load signal PCLOAD, receives and outputs the data bit stored in the first latch circuit 210 or dumps the inputted data to the first latch circuit 210.

The bit line voltage supply circuit 240 is controlled by the data bits latched in the first and second latch circuits 210 and 220, or first and second control signals VBL1 and VBL2. The bit line voltage supply circuit 240 supplies any one of the power supply voltage Vcc, the ground voltage Vss and a variable voltage BLPWR to the bit line, thereby achieving the programming of the memory cell.

The voltage generator circuit 280 generates the variable voltage BLPWR. The variable voltage BLPWR is used in the MSB programming operation and has a value between the power supply voltage Vcc and the ground voltage Vss. The page buffer controller 290 supplies the control signals and the like to the respective blocks of the page buffer.

Respective internal circuit structures of the first to third latch circuits 210, 220 and 230, the bit line voltage supply circuit 240 and the precharge circuit 250 according to an embodiment of the present invention and their operation principles will be described later in detail with reference to FIG. 3.

Figure 3:
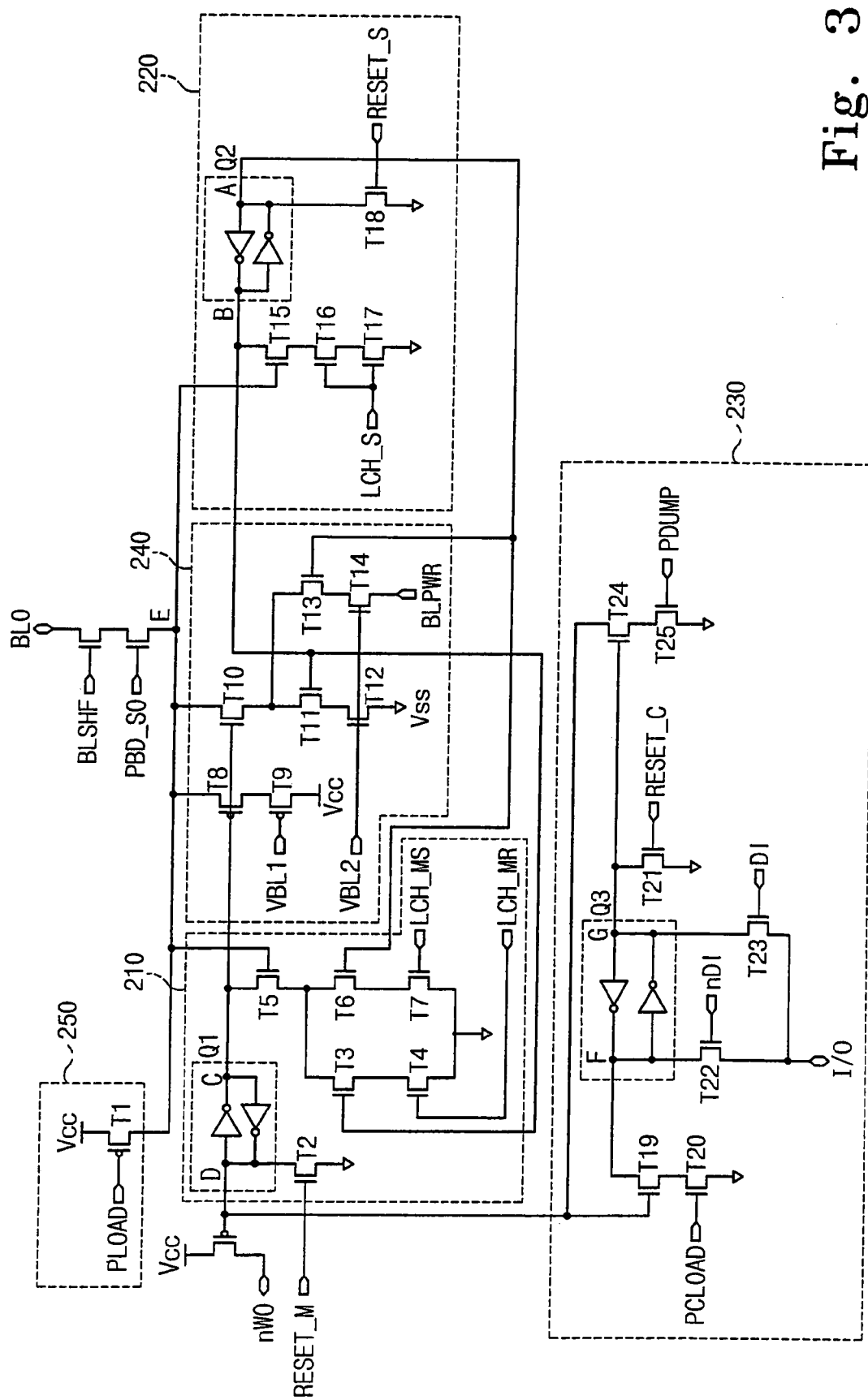
FIG. 3 is a circuit diagram of a flash memory device with multi-level cell according to an embodiment of the invention.

FIG. 3 is a circuit diagram of an example page buffer 200 according to embodiments of the present invention. During the reading operation, the page buffer 200 serves as a means for detecting and amplifying information applied on corresponding bit line. During the programming operation, the page buffer 200 serves as a way to latch external data and to supply a voltage corresponding to the latched data to the corresponding bit line. Additionally, during the programming verification operation, the page buffer 200 serves as a way to verify whether or not the programming is carried out well.

Referring to FIG. 3, the page buffer 200 includes the three latch circuits 210, 220 and 230, which perform different functions from each other, and the bit line voltage supply circuit 240 for supplying a predetermined voltage to the bit line. The latch circuits 210, 220 and 230 include latches Q1, Q2 and Q3, respectively, each of which is provided with two inverters cross-connected to each other. Ways to initialize nodes A, D and G before the reading and programming operations are provided at the nodes A, D and G of the latches Q1, Q2 and Q3. Gates of the NMOS transistors T2, T18 and T21 are initialized to a low level "L" if reset signals RESET_M, RESET_S and RESET_C become a high level (H). Meanwhile, latch reset circuits for setting the other nodes B, C and F to a low level (L) are provided at the other nodes B, C and F of the latches Q1, Q2 and Q3. The latch reset circuits will be described below.

The first latch circuit 210 includes the first latch Q1 and the first latch reset circuit. The first latch Q1 is formed with two inverters and the first latch reset circuit is formed with NMOS transistors T3 to T7. A current path T5-T6-T7 or T5-T3-T4 of the NMOS transistors T3 to T7 is connected in series between the node C of the first latch Q1 and the ground GND. A gate of the NMOS transistor T5 is connected to the node E. Gates of the transistors T3 and T6 are connected to the nodes B and A of the second latch Q2, respectively, and the transistors T3 and T6 are turned on or off according to each node of the second latch Q2. The first latch signal LCH_MR and the second latch signal LCH_MS are applied to gates of the NMOS transistors T4 and T7, respectively.

The second latch circuit 220 includes the second latch Q2 and the second latch reset circuit. The second latch Q2 is formed with two inverters and the second latch reset circuit is formed with NMOS transistors T15 to T17. A current path T15-T16-T17 of the NMOS transistors T15 to T17 is connected in series between the node B of the second latch Q2 and the ground GND. A gate of the NMOS transistor T15 is connected to the node E. The third latch signal LCH_S is applied to gates of the NMOS transistors T16 and T17.

The third latch circuit 230 includes the third latch Q3 and the third latch reset circuit. The third latch Q3 is formed with two inverters and the third latch reset circuit is formed with NMOS transistors T19 and T20. A current path of the transistors T19 and T20 is connected in series between the node F of the third latch Q3 and the ground GND. A gate of the NMOS transistor T19 is connected to the node D of the first latch circuit 210 and thus the transistor T19 is turned on or off according to the node D. The second node signal PCLOAD is applied to a gate of the NMOS transistor T20. If the second load signal PCLOAD is a high level in a state that the node D is a high level, the node F is set to a low level. The third latch circuit 230 also supports a cache function. The cache function is to load a next to-be-programmed data into the page buffer while a previous loaded data is programmed, or to output a sensed data to an exterior while sensing the data.

Referring to FIG. 3, the bit line voltage supply circuit 240 includes a first voltage supply line for preventing the programming operation by forming a current path T8-T9 between the node E and the power supply voltage Vcc, a second voltage supply line for performing the programming operation by forming a current path T10-T11-T12 between the node E and a reference ground voltage Vss, and a third voltage supply line for performing the programming operation by forming a current path T10-T13-T14 between the node E and the variable voltage BLPWR.

The first voltage supply line is formed with two PMOS transistors T8 and T9. The PMOS transistor T8 is controlled by the node C and the PMOS transistor T9 is controlled by a first control signal VBL1. If the first control signal VBL1 is set to a low level when the node C is at a low level, the power supply voltage Vcc is applied to the bit line so that the programming to the selected memory cell is prevented. In other words, the threshold voltage of the memory cell is not changed.

The second voltage supply line is formed with three NMOS transistors T10, T11 and T12. The NMOS transistors T10, T11 and T12 are controlled by the node C, the node B and a second control signal VBL2, respectively. If the second control signal VBL2 is set to a high level in a state that the nodes C and B are all in a high level, the ground reference voltage Vss is applied to the bit line so that the programming to the selected memory cell is performed. In other words, the threshold voltage of the memory cell increases.

The third voltage supply line is formed with three NMOS transistors T10, T13 and T14. The NMOS transistors T10, T13 and T14 are controlled by the level of the node C, the level of the node A and the second control signal VBL2, respectively. If the second control signal VBL2 is set to a high level in a state that the nodes C and A are all in a high level, the variable voltage BLPWR is applied to the bit line so that the programming to the selected memory cell is performed. In other words, the threshold voltage of the memory cell increases. Here, the variable voltage BLPWR is a voltage that is supplied to the bit line through the third voltage supply line and a voltage that is applied when the memory cell is programmed from a level [10] to a level [00] during the MSB programming operation.

Referring to FIG. 3, there is provided the precharge circuit 250 for supplying the precharge voltage to the bit line or the node E. The precharge circuit 250 is provided with one PMOS transistor T1 and controlled by the first load signal PLOAD. If the first load signal PLOAD becomes a low level, the power supply voltage Vcc is applied to the node E so that the NMOS transistors T5 and T15 of the first and second latch reset circuits are turned on.

Hereinafter, the reading and programming operations of the flash memory device according to embodiments of the present invention will be described with reference to the accompanying drawings.

II. MLC Reading Operation

Figure 4:
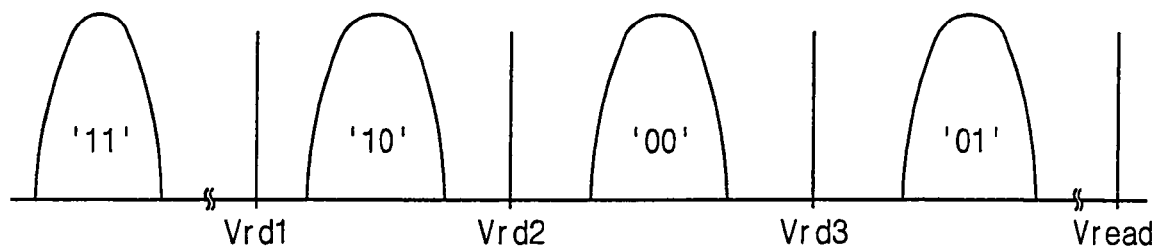
FIG. 4 is a diagram that illustrates data storage states of a multi-level cell according to an embodiment of the invention.

FIG. 4 is a diagram that illustrates states of data bits corresponding to the threshold voltage distributions of the memory cell. Respective data bits are changed differently by 1 bit with respect to their adjacent data bits. Accordingly, assuming that the data bits corresponding to the lowest threshold voltage distribution are [11], the data bits become [11], [10], [00] and [01].

Figure 5:
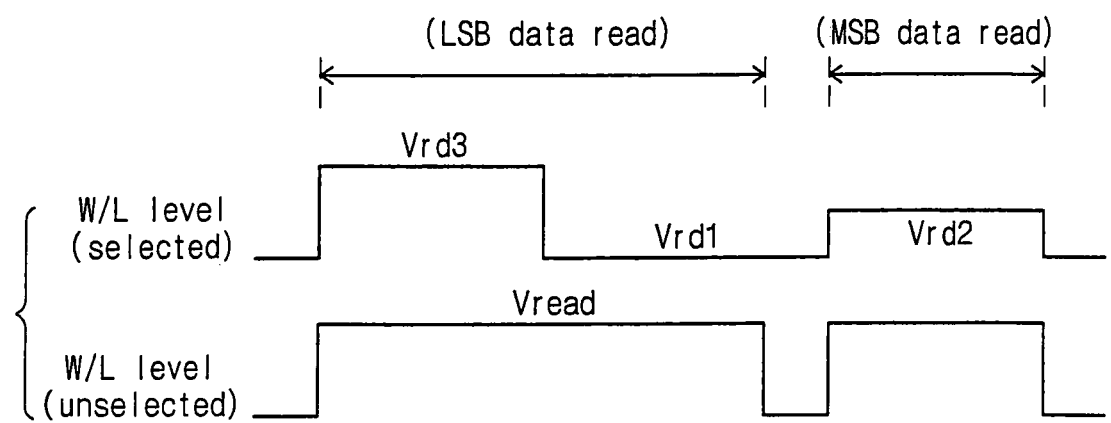
FIG. 5 is a timing diagram that illustrates voltages that are applied to a word line during a reading operation according to an embodiment of the invention.

FIG. 5 is a diagram that illustrates voltage levels applied to the selected or unselected word line. The word line voltage is supplied from the word line voltage supply circuit 270 (FIG. 2). For example, the voltage Vrd1 of 0 V, the voltage Vrd2 of 1 V and the voltage Vrd3 of 2 V are supplied to the selected word line at the reading operation, and the voltage Vread of 6 V is supplied to the unselected word line.

Whether the memory cell is an on-cell or an off-cell is determined by the voltage supplied to the selected word line at the reading operation. If the word line voltage is higher than the threshold voltage, the memory cell becomes the off-cell to thereby precharge the bit line. If the word line voltage is lower than the threshold voltage, the memory cell becomes the on-cell to thereby discharge the bit line.

Referring to FIG. 5, the reading operation is divided into a LSB reading operation and a MSB reading operation. During the LSB reading operation, the voltage Vrd3 (e.g., 2 V) is applied to the selected word line, then the voltage Vrd1 (e.g., 0 V) is applied. During the same time, the voltage Vread (e.g., 6 V) is applied to the unselected word line. During the MSB reading operation, the voltage Vrd2 (e.g., 1 V) is applied to the selected word line and the voltage Vread (e.g., 6 V) is applied to the unselected word line.

FIGS. 6 and 7 are example timing charts of the reading operation according to embodiments of the present invention. The reading operation is achieved by performing the LSB reading operation and the MSB reading operation. The LSB reading operation is also achieved by performing an LSB1 reading operation and an LSB2 reading operation in sequence and outputting the LSB data. During the LSB1 reading operation, the word line voltage Vrd3 is applied to the selected word line. During the LSB2 reading operation, the word line voltage Vrd1 is applied to the selected word line. The MSB reading operation is performed after the LSB reading operation. During the MSB reading operation, the word line voltage Vrd2 is applied and the MSB data is outputted. The MSB output data and the LSB output data are data bits that are programmed into the memory cell.

FIG. 6 is a timing chart of the LSB reading operation.

Referring to FIG. 6, first, two latches Q1 and Q2 are reset. In other words, if the first reset signal RESET_M and the second reset signal RESET_S become a high level to turn on the NMOS transistors T2 and T18, the nodes A and D are set to a low level and the nodes B and C are set to a high level. Since the nodes B and C are the high level, the NMOS transistors T10 and T11 are turned on. At this time, if the second control signal VBL2 becomes a high level, the NMOS transistor T12 is turned on, so that the bit line is discharged. Consequently, the node E is set to a low level.

If the first load signal PLOAD is set to a low level while the second control signal VBL2 is in a low level, the PMOS transistor Ti is turned on and the NMOS transistor T12 is turned off, so that the bit line is precharged. At this time, the node E is set to a high level. Then, the LSB1 reading operation is carried out. The voltage Vrd3 (e.g., 2 V) is applied to the selected word line and the voltage Vread (e.g., 6 V) is applied to the unselected word line.

If the data of the selected memory cell is [01], the threshold voltage distribution of the cell transistor is between 2.3 V to 2.7 V, so that the cell transistor is turned off. Accordingly, the node E is maintained in the high level and the NMOS transistor T15 is turned on. At this time, if the third latch signal LCH_S is set to a high level, the NMOS transistors T16 and T17 are turned on, so that the nodes B and A are changed into a low level and a high level, respectively.

If the data of the selected memory cell is [00], the threshold voltage distribution of the cell transistor is 1.3 V to 1.7 V, so that the cell transistor is turned on. Accordingly, the node E is changed into a low level. At this time, since the NMOS transistor T15 is turned off, the nodes B and A are respectively maintained in a high level and a low level, even when the third latch signal LCH_S is set to a high level. The cases of the memory cell containing [10] and [11] are equal to the case of [00].

According to the LSB1 reading operation, the voltage Vrd3 is applied to the selected word line and the data is stored in the second latch Q2. When the data of the selected memory cells are [11], [10], [00], and [01], the node B of the second latch Q2 becomes a high level, a high level, a high level and a low level, respectively.

Referring to FIG. 6, the first load signal PLOAD is again set to a low level. At this time, the PMOS transistor T1 is turned on so that the bit line is precharged. The node E is set to a high level so that the NMOS transistors T5 and T15 are turned on. Thereafter, the LSB2 reading operation is carried out. The voltage Vrd1 (e.g., 0 V) is applied to the selected word line and the voltage Vread (e.g., 6 V) is applied to the unselected word line.

When the data of the selected memory cells are [01], [00], and [10], the threshold voltage distributions of the cell transistor are 2.3 V to 2.7 V, 1.3 V to 1.7 V, and 0.3 V to 0.7 V, respectively, so that the cell transistors are turned off. Accordingly, the node E is maintained in the high level so that the NMOS transistors T5 and T15 are turned on. At this time, if the first latch signal LCH_MR is set to a high level, the NMOS transistor T4 is also turned on.

Meanwhile, the NMOS transistors T16 and T17 are turned off since the third latch signal LCH_S is in a low level. Accordingly, the node B is maintained in the previous state. In other words, the node B is a low level if the data of the selected memory cell is [01] and the node B is in a high level if the data of the selected memory cell is [00] or [10]. If the node B is a low level, i.e., if the data of the selected memory cell is [01], the NMOS transistor T3 is turned off so that the node C maintains the previous state, i.e., the high level. However, if the node B is a high level, i.e., if the data of the selected memory cell is [00] or [10], the NMOS transistor T3 is turned on so that the node C is changed into a low level.

According to the LSB2 reading operation, the voltage Vrd3 is applied to the selected word line and the data is stored in the first latch Q1. When the data of the selected memory cells are [11], [10], [00], and [01], the node C of the first latch Q1 becomes a high level, a low level, a low level, and a high level, respectively. Consequently, the node D becomes a low level, a high level, a high level, and a low level, respectively.

Referring to FIG. 6, an operation of outputting the LSB data is carried out. First, if the third reset signal RESET_C is set to a high level to turn on the NMOS transistor T21, the node G becomes a low level and the node F becomes a high level. Then, if the second load signal PCLOAD is set to a high level, the NMOS transistor T20 is turned on. At this time, when the node D of the first latch Q1 is a high level, i.e., the data of the selected memory cell is [10] or [00], the NMOS transistor T19 is turned on so that the nodes F and G are changed into a low level and a high level, respectively. When the node D of the first latch Q1 is a low level, i.e., the data of the selected memory cell is [11] or [01], the NMOS transistor T19 is turned off, so that the nodes F and G are maintained in a high level and a low level, respectively.

Accordingly, when the data of the selected memory cells is [11], [10], [00], and [01], the node G of the third latch Q3 becomes a low level, a high level, a high level, and a low level, respectively. At this time, if an input/output control signal DI is set to a high level, the data of the node G is outputted through the data line IO. A high level, a low level, a low level or a high level, respectively, which are reversed data of the node G, are read out at an exterior. These are equal to the respective LSB data of the selected memory cells, i.e., 1, 0, 0, 1 (H, L, L, H).

FIG. 7 is an example timing chart of the MSB reading operation according to an embodiment of the invention. Unlike the LSB reading operation, the MSB reading operation outputs the data by using the first latch Q1 alone.

Referring to FIG. 7, the MSB reading operation starts with a step of resetting the first latch Q1. In other words, if the first reset signal RESET_M becomes a high level to turn on the NMOS transistor T2, the node D is set to a low level and the node C is set to a high level. Since the node C is the high level, the NMOS transistor T10 is turned on. At this time, if the second control signal VBL2 becomes a high level, the NMOS transistors T12 and T14 are turned on. Meanwhile, since the nodes A and B of the second latch Q2 are in an unknown state, one of the NMOS transistors T11 or T13 is turned on. Accordingly, the bit line is discharged so that the node E is set to a low level.

The first load signal PLOAD is set to a low level. At this time, the PMOS transistor T1 is turned on so that the bit line is precharged. The node E is changed into a high level. Then, the MSB reading operation is carried out. The voltage Vrd2 (e.g., 1 V) is applied to the selected word line and the voltage Vread (e.g., 6 V) is applied to the unselected word line.

If the data of the selected memory cell is [01] or [00], the threshold voltage distributions of the cell transistor are 2.3 V to 2.7 V or 1.3 V to 1.7 V, respectively, so that the cell transistor is turned off. Accordingly, the node E is maintained in the high level and the NMOS transistor T5 is turned on. At this time, if the first latch signal LCH_MR and the second latch signal LCH_MS are set to a high level, the NMOS transistors T4 and T7 are turned on. Meanwhile, the nodes A and B of the second latch Q2 are in an unknown state, one of the NMOS transistors T3 and T6 is turned on. Accordingly, the nodes C and D are changed into a low level and a high level, respectively.

If the data of the selected memory cell is [10] or [11], the threshold voltage distributions of the cell transistor is 0.3 V to 0.7 V or −2.7 V or less, respectively, so that the cell transistor is turned on. Accordingly, the node E is changed into a low level. At this time, since the NMOS transistor T5 is turned off, the nodes C and D are respectively maintained in a high level and a low level, even when the first latch signal LCH_MR and the second latch signal LCH_MS are all set to a high level.

According to the MSB reading operation, the voltage Vrd2 is applied to the selected word line and the data is stored in the first latch Q1. When the data of the selected memory cells is [11], [10], [00], and [01], the node C of the first latch Q1 becomes a high level, a high level, a low level, and a low level, respectively. Consequently, the node D becomes a low level, a low level, a high level, and a high level, respectively.

Referring to FIG. 7, an example operation of outputting the MSB data is carried out. First, if the third reset signal RESET_C is set to a high level to turn on the NMOS transistor T21, the node G becomes a low level and the node F becomes a high level. Then, if the second load signal PCLOAD is set to a high level, the NMOS transistor T20 is turned on. At this time, if the node D of the first latch Q1 is a high level, i.e., the stored data is [00] or [01], the NMOS transistor T19 is turned on so that the nodes F and G are changed into a low level and a high level, respectively. If the node D of the first latch Q1 is a low level, i.e., the stored data is [10] or [11], the NMOS transistor T19 is turned off, so that the nodes F and G maintain a high level and a low level, respectively.

Accordingly, when the data of the selected memory cells is [11], [10], [00], and [01], the node G of the third latch Q3 becomes a low level, a low level, a high level, and a high level, respectively. At this time, if an input/output control signal DI is set to a high level, the data of the node G is outputted through the data line IO. A high level, a high level, a low level, and a low level, respectively, which are reversed data of the node G, are read out. These are equal to the MSB data of the selected memory cells, i.e., 1, 1, 0, and 0 (H, H, L, and L).

Consequently, the MLC reading operation is achieved by sequentially performing the operation of reading the LSB data (1, 0, 0, 1) and the operation of reading the MSB data (1, 1, 0, 0). The data of the multi-level cell can be detected from the results.

III. MLC Programming Operation

The programming operation includes the programming process of injecting electrons to the floating gates of the selected memory cell transistors, and a program verifying process of verifying whether the programmed memory cell transistors reach desired threshold voltages. The programming operation is repeatedly performed until the selected memory cells reach the desired threshold voltage levels. For the sake of convenience, a description of the repetitive programming operation will be omitted, and it is assumed that the selected memory cell reaches the desired threshold voltage level through one time programming operation.

In order to program the selected memory cells by using F-N tunneling, a predetermined program (e.g., 14 V to 19 V) is applied to the gates of the corresponding memory cells, and a ground voltage Vss or a predetermined voltage is applied to the channels of the corresponding memory cells. Accordingly, a high electric field is formed between the floating gates and the channels of the memory cells to be programmed. Due to the electric field, a tunneling occurs that the electrons of the channels pass through the oxide layers between the floating gates and the channels. Therefore, the electrons are accumulated at the floating gates of the corresponding memory cells, and the threshold voltages of the memory cells to be programmed increase due to the accumulation of the electrons at the floating gates. Meanwhile, the power supply voltage Vcc is applied to the channels of the corresponding memory cells in order to prevent the programming.

Figure 8A:
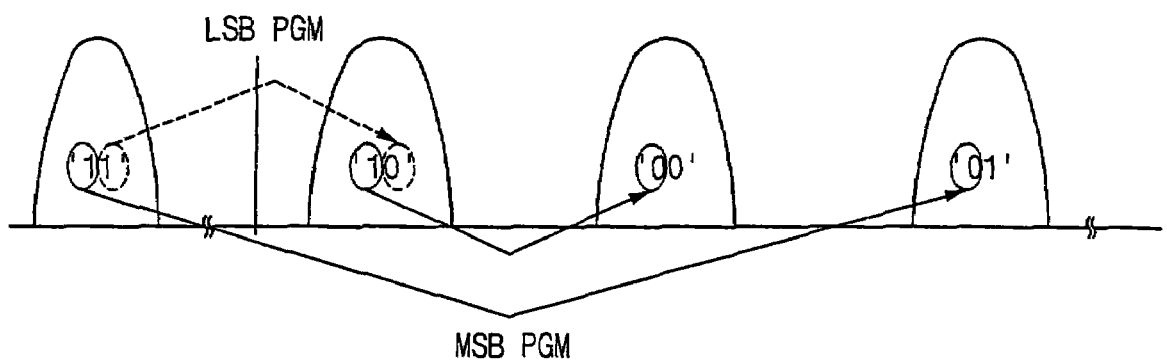
FIG. 8a is a diagram that illustrates a programming operation method according to an embodiment of the invention.

FIG. 8a graphically illustrates a concept of the programming method according to embodiments of the present invention. The described programming method is divided into an LSB programming operation and an MSB programming operation. First, the LSB programming operation is performed to change only the LSB. In other words, if the LSB data to be programmed is "0" the LSB programming operation changes the stored data from [11] to [10]. Otherwise, the stored data remains at [11]. Next, the MSB programming operation detects the result of the LSB programming operation and performs the MSB programming according to the detected result. If an LSB of "1" is detected and the MSB data to be programmed is "0," the MSB programming operation changes the data storage state from [10] to [01]. Otherwise, the data storage state remains at [11]. If an LSB of "0" is detected and the MSB data to be programmed is "0," the MSB programming operation changes the data storage state to from [10] to [00]. Otherwise, the data storage state remains at [10]. According to this programming method of embodiments of the invention, all the data bit states can be programmed through only two programming operations.

Figure 8B:
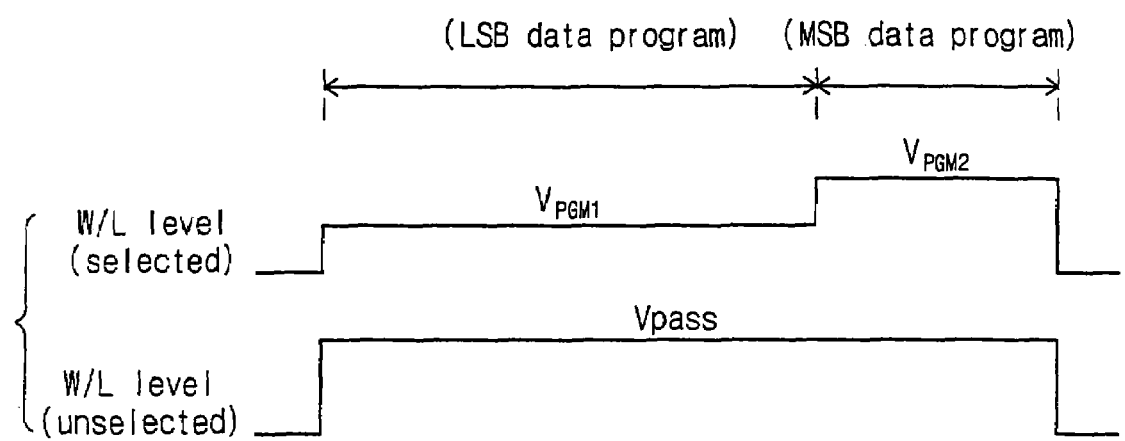
FIG. 8b is a timing diagram that illustrates voltages that are applied to a word line during a programming operation according to an embodiment of the invention.
Figure 11A:
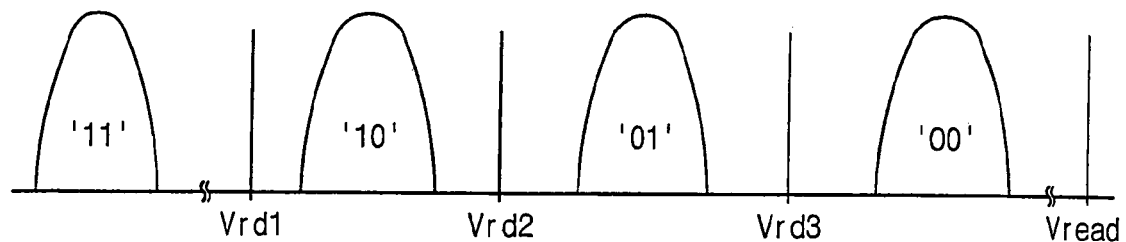
FIG. 11a is a diagram that illustrates data storage states of a multi-level cell according to a related art.
Figure 11B:
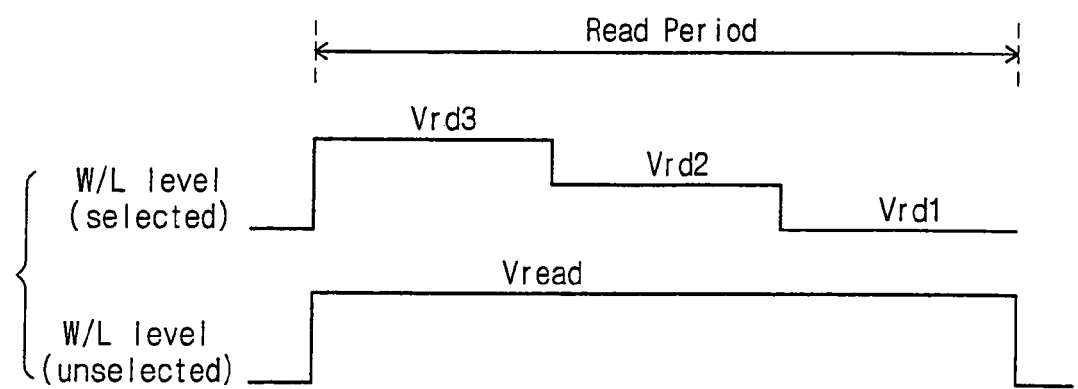
FIG. 11b is a timing diagram that illustrates voltages that are applied to a word line during a read operation of a multi-level cell according to a related art.
Figure 12:
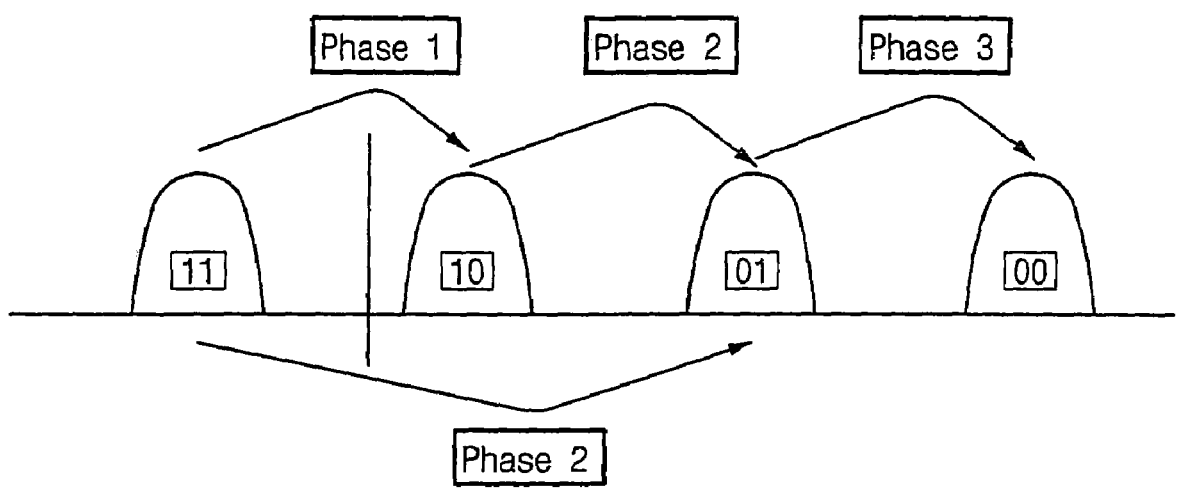
FIG. 12 is a diagram that illustrates a programming operation according to a related art.

FIG. 8b is a diagram that illustrates the voltage levels that are applied to the selected or unselected word lines during the programming operation. The word line voltage is supplied from the word line voltage supply circuit 270 (FIG. 2). In the programming operation, the voltage applied to the word line at the LSB programming operation is different from the voltage applied to the word line at the MSB programming operation. For example, the voltage VPGM1 applied to the word line at the LSB programming operation starts from 14 V, and the voltage VPGM2 applied to the word line at the MSB programming operation starts from 16 V. The voltage Vpass of 10 V is applied to the unselected word line.

FIGS. 9 and 10 are example timing charts of a programming operation according to embodiments of the present invention.

The programming operation is divided into the LSB programming period and the MSB programming period. The LSB programming operation is achieved by supplying the first bit line voltage (Vcc or Vss) to the bit line according to the LSB data to be programmed. The MSB programming operation is achieved by reading out the programmed LSB data and supplying the second bit line voltage (Vss or BLPWR) to the bit line according to the read LSB data.

A remarkable characteristic of the programming operation according to embodiments of the present invention is that the variable voltage BLPWR is applied to the bit line at the MSB programming operation and the programming operation is completed through one time LSB programming operation and one time MSB programming operation. The LSB programming operation and the MSB programming operation will be described below in detail with reference to FIGS. 9 and 10.

FIG. 9 is a timing chart of an example LSB programming operation.

The LSB programming operation starts with a process of resetting the third latch Q3 (FIG. 3). If the third reset signal RESET_C is set to a high level to turn on the NMOS transistor T21, the nodes G and F become a low level and a high level, respectively.

Then, if the input/output control signal DI is set to a high level to turn on the NMOS transistor T23, an external data is loaded in the node G. For example, when the data to be programmed into the selected memory cells are [11], [10], [00], and [01], the data loaded in the node G is [00], [01], [11], and [10], respectively. Here, since the LSBs are 0, 1, 1, and 0, a low level, a high level, a high level, and a low level, respectively are loaded on the node G. Consequently, the node F becomes a high level, a low level, a low level, and a high level, respectively.

Then, the first load signal PLOAD is set to a low level. The PMOS transistor T1 is turned on and thus the bit line is precharged. The node E is set to a high level to thereby turn on the NMOS transistor T5. At this time, if the first latch signal LCH_MR and the second latch signal LCH_MS are set to high level, the NMOS transistors T4 and T7 are turned on. Since the nodes A and B of the second latch Q2 are in an unknown state, one of the NMOS transistors T3 or T6 is turned on. Accordingly, the nodes C and D become a low level and a high level, respectively.

An operation of dumping the data from the node G to the node C is carried out. If a dumping control signal PDUMP is set to a high level, the NMOS transistor T25 is turned on. When the data to be programmed into the selected memory cells is [00] or [10], the LSB data loaded on the node G is a high level, so that the NMOS transistor T24 is turned on. Accordingly, the nodes D and C become in a low level and a high level, respectively. When the data to be programmed into the selected memory cells is [01] or [11], the LSB data loaded on the node G is a low level, so that the NMOS transistor T24 is turned off. Accordingly, the nodes D and C are maintained in a high level and a low level, respectively.

According to the result of the above-described dumping operation, when the data to be programmed into the selected memory cells is [11], [10], [00], and [01], the LSB data dumped to the node C is 0, 1, 1, and 0, respectively.

Referring to FIG. 9, a process of programming the LSB data is carried out. If the first control signal VBL1 and the second control signal VBL2 are respectively set to a low level and a high level, the PMOS transistor T19 and the NMOS transistors T12 and T14 are turned on. Since the nodes A and B of the second latch Q2 in an unknown state, one of the NMOS transistors T11 or T13 are turned on. At this time, if the node C is a high level, the NMOS transistor T10 is turned on to thereby change the node E into a low level. However, if the node C is a low level, the PMOS transistor T8 is turned on so that the node E is maintained in a high level. Accordingly, when the data to be programmed into the selected memory cells are [11], [10], [00], and [01], the node E becomes a high level, a low level, a low level, and a high level, respectively.

Since the bit line is charged to the power supply voltage when the node E is a high level, the programming to the memory cell is prevented. Only when the node E is a low level, i.e., the ground reference voltage, the programming to the corresponding memory cell is carried out. At this time, a voltage of about 14 V is applied to the word line. A voltage applied to the word line is sequentially increased about 0.2 V to 0.3 V according to the verification result of the programming states. Accordingly, if the data to be programmed is [10] or [00], the programming is performed and the threshold voltage of the memory cell is increased. For example, the threshold voltage distributions of the memory cells become 0.3 V to 0.7 V. However, if the data to be programmed is [11] or [01], the programming is prevented, and thereby maintains a state in which the threshold voltage distributions are erased, for example, a state of −2.7 V or less.

Then, the programming verification operation is carried out. The detecting operation for the programming verification is almost similar to the above-described reading operation. However, in order to secure a margin between a voltage of the selected word line and the threshold voltage during the reading operation, a voltage higher than that applied during the reading operation by a predetermined level (e.g., 0.2 V to 0.3 V) is applied to the selected word line.

FIG. 10 is a timing chart of the MSB programming operation.

The MSB programming operation starts with a step of resetting the third latch Q3. If the third reset signal RESET_C is set to a high level to turn on the NMOS transistor T21, the nodes G and F become a low level and a high level, respectively.

Then, if the input/output control signal DI is set to a high level and thus the NMOS transistor T23 is turned on, an external data is loaded in the node G. For example, if the data to be programmed into the selected memory cells is [11], [10], [00], and [01], the data loaded in the node G becomes [00], [01], [11], and [10], respectively. Here, since the MSBs are 0, 0, 1, and 1, a low level, a low level, a high level, and a high level, respectively, are loaded at the node G. Consequently, the node F is set to a high level, a high level, a low level, and a low level, respectively.

Then, the first load signal PLOAD becomes a low level. At this time, the PMOS transistor Ti is turned on and the bit line is precharged. The node E is set to a high level to turn on the NMOS transistor T5. At this time, if the first latch signal LCH_MR and the second latch signal LCH_MS are set to a high level, the NMOS transistors T4 and T7 are turned on. Since the nodes A and B of the second latch Q2 are in an unknown state, one of the NMOS transistors T3 or T6 is turned on. Accordingly, the nodes C and D are set to a low state and a high state, respectively.

Then, an operation of dumping data from the G node to the node C is carried out. If the dump control signal PDUMP is set to a high level, the NMOS transistor T25 is turned on. If the data to be programmed into the selected memory cells is [01] or [00], the NMOS transistor T24 is turned on since the MSB data loaded on the node G is "1," i.e., a high level. Accordingly, the nodes D and C are changed into a low state and a high state, respectively. Meanwhile, if the data to be programmed into the selected memory cells is [10] or [11], the NMOS transistor T24 is turned off since all the MSB data loaded on the node G is "0," i.e., a low level. Accordingly, the nodes D and C are maintained in a high level and a low level, respectively.

According to the result of the above-described dumping operation, if the data to be programmed into the selected memory cells is [11], [10], [00], and [01], the MSB data dumped to the node C are 0, 0, 1, and 1, respectively.

Referring to FIG. 10, a process of reading out the memory cell data stored through the LSB programming operation is carried out. The read data is stored in the second latch Q2. Prior to the reading operation, the second reset signal RESET_S is set to a high level so that the nodes A and B become a low level and a high level, respectively. If the memory cell is in a programmed state through the LSB programming operation, the node E becomes a high state. If the memory cell is in an erased state, the node E becomes a low level.

If the third latch signal LCH_S is set to a high level, the NMOS transistors T16 and T17 are turned on. At this time, the nodes A and B are determined according to the states of the node E. If the node E is a high level, the NMOS transistor T15 is turned on so that the node B is changed into a low level. If the node E is a low level, the NMOS transistor T15 is turned off so that the node B is maintained at a high level. Accordingly, if the data to be programmed is [11], [10], [00], and [01], the node B becomes a high level, a low level, a low level, and a high level, respectively.

Then, the MSB programming operation is carried out. If the first control signal VBL1 and the second control signal VBL2 are respectively set to a low level and a high level, the PMOS transistor T9 and the NMOS transistors T12 and T14 are turned on.

First, if the data to be programmed is [01], the result of the LSB programming operation is the erased state (e.g., a state that the threshold voltage distribution is −2.7 V or less). Since the nodes B and C are a high level, the NMOS transistors T10 and T11 are turned on so that the node E becomes the ground reference voltage. Accordingly, the corresponding memory cell is sufficiently programmed, so that the threshold voltage distribution becomes about 2.3 V to 2.7 V. In other words, the result of the MSB programming operation is that the stored data becomes a state of [01].

Second, if the data to be programmed is [00], the result of the LSB programming operation is the programmed state (e.g., a state that the threshold voltage distribution is 0.3 V to 0.7 V). Since the nodes B and A are respectively a low level and a high level, the NMOS transistor T13 is turned on. Since the node C is a high level, the NMOS transistor T11 is turned on so that the node E has a predetermined voltage BLPWR between the power supply voltage Vcc and the ground voltage Vss. Accordingly, the corresponding memory cell is slightly programmed, so that the threshold voltage distribution becomes approximately 1.3 V to 1.7 V. In other words, the result of the MSB programming operation is that the stored data becomes a state of [00].

Third, if the data to be programmed is [10], the result of the LSB programming operation becomes the programmed state (e.g., a state that the threshold voltage distribution is 0.3 V to 0.7 V). Since the node C is a low level, the PMOS transistor T8 is turned on and the NMOS transistor T10 is turned off. Accordingly, the corresponding memory cell is prevented from being programmed since the node E is set to the power supply voltage Vcc, and the threshold voltage distribution is maintained in the state of 0.3 V to 0.7 V. In other words, the result of the MSB programming operation is that the stored data becomes a state of [10].

Fourth, if the data to be programmed is [11], the result of the LSB programming operation is the erased state (e.g., a state that the threshold voltage distribution is −2.7 V or less). Since the node C is a high level, the PMOS transistor T8 is turned on and the NMOS transistor T10 is turned off. Accordingly, the node E is set to the power supply voltage, so that the corresponding memory cell is prevented from being programmed and the threshold voltage distribution is maintained in the state of −2.7 V as it is. In other words, the result of the MSB programming operation is that the stored data becomes a state of [11].

Consequently, the multi-level cell may have the threshold voltage distributions of [11] (−2.7 V or less), [10] (0.3 V to 0.7 V), [00] (1.3 V to 1.7 V) or [01] (2.3 V to 2.7 V) through the LSB programming operation and the MSB programming operation.

According to an embodiment of the invention, at the programming operation of the multi-level cell, data having four states can be programmed through two programming operations, thereby reducing the programming operation time.

As described above, the invention can be implemented in many ways, and it is unnecessary that the invention be practiced exactly as described. In other words, the invention can be embodied in a number of ways without deviating from its inventive aspects. What follows are detailed examples of embodiments of the invention that are presented without limitation.

A flash memory device according to an embodiment of the invention programs lower and upper data bits into memory cells at first and second programming periods. The flash memory device includes: word lines and bit lines connected to the memory cells; a word line voltage supply circuit connected to the word lines, for supplying a first word line voltage VPGM1 to the word lines during the first programming period and supplying a second word line voltage VPGM2 to the word lines during the second programming period, the second word line voltage VPGM2 being higher than the first word line voltage; and a bit line voltage supply circuit connected to the bit lines, for supplying a first bit line voltage to the bit lines according to a lower data bit to be programmed during the first programming period so that the lower data bit is programmed, reading out the programmed lower data bit prior to the second programming period, and supplying a second bit line voltage to the bit lines according to upper data bit to be programmed and the read lower data bit during the second programming period so that the upper data bit is programmed.

The first bit line voltage is a power supply voltage Vcc if the lower data bit to be programmed is "1," and a ground voltage Vss if the lower data bit to be programmed is "0." The second bit line voltage is the ground voltage Vss if the programmed lower data bit is "1," and a variable voltage BLPWR if the programmed lower data bit is "0."

In accordance with an embodiment of the invention, a flash memory device includes: word lines and bit lines connected to the memory cells; a word line voltage supply circuit connected to the word lines, for supplying a first word line voltage VPGM1 to the word lines during the first programming period and supplying a second word line voltage VPGM2 to the word lines during the second programming period, the second word line voltage VPGM2 being higher than the first word line voltage; and a page buffer connected to the bit lines. The page buffer includes: a first latch circuit for latching the lower and upper data bits to be respectively programmed during the first and second programming periods; a bit line voltage supply circuit for supplying a first bit line voltage to the bit lines according to the lower data bit to be programmed at the first programming period so that the lower data bit is programmed, and for supplying a second bit line voltage to the bit lines according to upper data bit to be programmed and the read lower data bit during the second programming period so that the upper data bit is programmed; a second latch circuit for detecting the lower data bit programmed prior to the second programming period and latching the lower data bit; and a bit line voltage supply circuit for supplying a second bit line voltage to the bit line according to the upper data bit to be programmed and the read lower data bit during the second programming period so that the upper data bit is programmed.

According to an embodiment of the invention, the page buffer further includes a precharge circuit for precharging the bit lines.

The first bit line voltage is a power supply voltage Vcc if the lower data bit to be programmed is "1," and a ground voltage Vss if the lower data bit to be programmed is "0." The second bit line voltage is the ground voltage Vss if the programmed lower data bit is "1," and a variable voltage BLPWR if the programmed lower data bit is "0." Here, the variable voltage BLPWR is a bit line voltage that programs a state of [10] to a state of [00] during the second programming period.

Each of the first and second latch circuit includes: a latch for latching one data bit; a way to initialize one node of the latch prior to the programming operation; and a reset circuit for resetting the other node of the latch during the first and second programming periods.

In accordance with another embodiment of the invention, a flash memory device includes: word lines and bit lines connected to the memory cells; a word line voltage supply circuit connected to the word lines, for supplying a first word line voltage VPGM1 to the word lines during a first programming period and supplying a second word line voltage VPGM2 to the word lines during a second programming period, the second word line voltage VPGM2 being higher than the first word line voltage; and a page buffer connected to the bit lines. The page buffer includes: a precharge circuit for precharging the bit lines prior to the first and second programming periods; a third latch circuit for loading the lower and upper data bits to be respectively programmed prior to the first and second programming periods; a first latch circuit for latching the lower and upper data bits to be respectively programmed during the first and second programming periods; a bit line voltage supply circuit for supplying a first bit line voltage to the bit line according to the lower data bit to be programmed during the first programming period so that the lower data bit is programmed; a second latch circuit for detecting the lower data bit programmed prior to the second programming period and latching the lower data bit; and a bit line voltage supply circuit for supplying a second bit line voltage to the bit lines according to the upper data bit to be programmed and the read lower data bit during the second programming period so that the upper data bit is programmed.

The first bit line voltage is a power supply voltage Vcc if the lower data bit to be programmed is "1," and a ground voltage Vss if the lower data bit to be programmed is "0." The second bit line voltage is the ground voltage Vss if the programmed lower data bit is "1," and a variable voltage BLPWR if the programmed lower data bit is "0." Here, the variable voltage BLPWR is a bit line voltage that programs a state of [10] to a state of [00] during the second programming period.

Each of the first, second and third latch circuits includes: a latch for latching one data bit; an initalizer for initializing one node of the latch prior to the programming operation; and a reset circuit for resetting the other node of the latch during the first and second programming periods.

Another embodiment of the invention provides methods for programming 2-bit lower and upper data bits into memory cells during the first and second programming periods. The method includes supplying a first word line voltage to the word lines during the first programming period and supplying a first bit line voltage to the bit lines according to lower data bit to be programmed, so that the lower data bit is programmed; reading the lower data bit programmed prior to the second programming period; and supplying a second word line voltage to the word lines during the second programming period and supplying a second bit line voltage to the bit lines according to the upper data bit to be programmed and the read lower data bit, so that the upper data bit is programmed.

The method further includes the processes of: precharging the bit lines prior to the first and second programming periods; loading the lower and upper data bits to be programmed; and latching the lower and upper data bits to be programmed.

Yet another embodiment of the invention provides a method for reading 2-bit lower and upper bits programmed in memory cells. This method includes sequentially applying a third word line voltage Vrd3 and a first word line voltage Vrd1 to a selected word line to read out the lower data bit; applying a second word line voltage Vrd2 to the selected word line to read the upper data bit; and combining the read lower and upper data bits to output the programmed data bits to an exterior.

Reading the lower data bit includes: applying the third word line voltage Vrd3 to the selected word line to detect an information on the lower data bit; and reading the lower data bit determined by the detected information and an information on the lower data bit, the information on the lower data bit being detected by applying the first word line voltage Vrd1 to the selected word line.

It is to be understood that both the foregoing general description and the following detailed description of the present invention are exemplary and explanatory and are intended to provide further explanation of the invention as claimed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for reading 2-bit lower and upper data bits programmed in memory cells, comprising:
   sequentially applying a word line voltage Vrd3 and a word line voltage Vrd1 to a selected word line to read out the lower data bit;
   applying a word line voltage Vrd2 to the selected word line to read the upper data bit; and
   combining the read lower and upper data bits to output the programmed data bits.

2. The method of claim 1, wherein reading the lower data bit comprises:
   applying the word line voltage Vrd3 to the selected word line to detect a first information on the lower data bit;
   applying the word line voltage Vrd1 to the selected word line to detect a second information on the lower data bit; and
   reading the lower data bit determined by the first information and the second information.

* * * * *